US009875986B2

(12) United States Patent  
Sakuma et al.

(10) Patent No.: US 9,875,986 B2  
(45) Date of Patent: Jan. 23, 2018

(54) MICRO-SCRUB PROCESS FOR FLUXLESS MICRO-BUMP BONDING

(71) Applicant: International Business Machines Corporation, Armonk, NY (US)

(72) Inventors: Katsuyuki Sakuma, Fishkill, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/053,723

(22) Filed: Feb. 25, 2016

(65) Prior Publication Data

US 2017/0103963 A1   Apr. 13, 2017

Related U.S. Application Data

(60) Provisional application No. 62/239,531, filed on Oct. 9, 2015.

(51) Int. Cl.  
*H01L 23/00* (2006.01)

(52) U.S. Cl.  
CPC .............. *H01L 24/81* (2013.01); *H01L 24/17* (2013.01); *H01L 2224/1701* (2013.01);  
(Continued)

(58) Field of Classification Search  
None  
See application file for complete search history.

(56) References Cited

U.S. PATENT DOCUMENTS 6,212,768 B1   4/2001   Murakami  
6,269,999 B1   8/2001   Okazaki et al.  
(Continued)

FOREIGN PATENT DOCUMENTS

DE   19818436 A1   3/1999  
JP   58-68945 A   4/1983  
(Continued)

OTHER PUBLICATIONS

J. Hay et al., "Continuous Stiffness Measurement During Instrumented Indentation Testing," Experimental Techniques, May/Jun. 2010, pp. 86-94, vol. 34, No. 3.  
(Continued)

*Primary Examiner* — Reema Patel  
*Assistant Examiner* — Steven Christopher  
(74) *Attorney, Agent, or Firm* — Louis J. Percello; Ryan, Mason & Lewis, LLP (57) ABSTRACT

A fluxless bonding process is provided. An array of micro solder bumps of a first semiconductor structure is aligned to an array of bonding pads of a second semiconductor structure under an applied bonding force. An environment is provided to prevent oxides from forming on the solder bump structures and bonding pads during the bonding process. A scrubbing process is performed at a given scrubbing frequency and amplitude to scrub the micro solder bumps against the bonding pads in a direction perpendicular to the bonding. Heat is applied to at least the first semiconductor structure to melt and bond the micro solder bumps to the bonding pads. The first semiconductor structure is cooled down to solidify the molten solder. Coplanarity is maintained between the bonding surfaces of the semiconductor structures within a given tolerance during the scrubbing and cooling steps until solidification of the micro solder bumps.

12 Claims, 5 Drawing Sheets

(52) U.S. Cl.
CPC .............. *H01L 2224/17104* (2013.01); *H01L 2224/812* (2013.01); *H01L 2224/81121* (2013.01); *H01L 2224/81898* (2013.01)

(56) References Cited

U.S. PATENT DOCUMENTS

| | | | |
|---|---|---|---|
| 6,375,060 B1 | 4/2002 | Silhavy | |
| 6,821,813 B2 | 11/2004 | Su | |
| 7,642,135 B2 | 1/2010 | Liang | |
| 2006/0138657 A1* | 6/2006 | Kushima | H01L 21/6835 257/737 |
| 2012/0098126 A1* | 4/2012 | Iwasaki | H01L 24/11 257/737 |
| 2016/0126213 A1* | 5/2016 | Celia, Jr. | B23K 37/0408 228/101 |

FOREIGN PATENT DOCUMENTS

| | | |
|---|---|---|
| JP | 3851760 B2 | 11/2006 |
| JP | 4887879 B2 | 2/2012 |
| KR | 1020070066482 A | 6/2007 |
| WO | 2014186337 A1 | 11/2014 |

OTHER PUBLICATIONS

M. Koyanagi et al., "Future System-on-Silicon LSI Chips," IEEE Micro, Jul./Aug. 1998, pp. 17-22, vol. 18, No. 4.
K. Sakuma et al., "3D Chip-Stacking Technology with Through-Silicon Vias and Low-Volume Lead-Free Interconnections," IBM Journal of Research and Development, Nov. 2008, pp. 611-622, vol. 52, No. 6.
M.-H. Chan et al., "Effects of Cleaning Process on the Reliability of Ultra-Fine Gap for 3D Package," IEEE 65th Electronic Components and Technology Conference (ECTC), May 2015, pp. 1193-1196.
J. Maria et al., "3D Chip Stacking with 50 um Pitch Lead-Free Micro-C4 Interconnections," IEEE 61st Electronic Components and Technology Conference (ECTC), May/Jun. 2011, pp. 268-273.
K. Sakuma et al., "Fluxless Bonding for Fine-Pitch and Low-Volume Solder 3-D Interconnection," IEEE 61st Electronic Components and Technology Conference (ECTC), May/Jun. 2011, pp. 7-13.
Y.-M. Lin et al., "Low Temperature Bonding Using Non-Conductive Adhesive for 3D Chip Stacking with 30um-Pitch Micro Solder Bump Interconnections," IEEE 62nd Electronic Components and Technology Conference (ECTC), May/Jun. 2012, pp. 1656-1661.
Q. Tan et al., "Thermosonic Flip-Chip Bonding Using Longitudinal Ultrasonic Vibration," IEEE Transactions on Components, Packaging, and Manufacturing Technology—Part B, Feb. 1998, pp. 53-58, vol. 21, No. 1.
J. Hwang et al., "Fine Pitch Chip Interconnection Technology for 3D Integration," IEEE 60th Electronic Components and Technology Conference (ECTC), Jun. 2010, pp. 1399-1403.
C.-J. Zhan et al., "Development of Fluxless Chip-on-Wafer Bonding Process for 3DIC Chip Stacking with 30um Pitch Lead-Free Solder Micro Bumps and Reliability Characterization," IEEE 61st Electronic Components and Technology Conference (ECTC), May/Jun. 2011, pp. 14-21.
R. Daily et al., "Microscrubbing: an Alternative Method for 3D Thermocompression Bonding CuCu Bumps and High Bump Density Devices with Low Force, Time and Temperature," IEEE 63rd Electronic Components and Technology Conference (ECTC), May 2013, pp. 255-259.
D.D. Evans, Jr. et al., "AuSi and AuSn Eutectic Die Attach Case Studies from Small (12 mil) to Large (453 mil) Die," International Microelectronics and Packaging Society (IMAPS), Oct./Nov. 2010, pp. 000898-000905, vol. 2010, No. 1.
K. Sakuma et al., "An Enhanced Thermo-Compression Bonding Process to Address Warpage in 3D Integration of Large Die on Organic Substrates," IEEE 65th Electronic Components and Technology Conference (ECTC), May 2015, pp. 318-324.
K. Sakuma et al., "Differential Heating/Cooling Chip Joining Method to Prevent Chip Package Interaction Issue in Large Die with Ultra Low-k Technology," IEEE 62nd Electronic Components and Technology Conference (ECTC), May/Jun. 2012, pp. 430-435.
Kenneth A. Brakke, "The Surface Evolver," Experimental Mathematics, 1992, pp. 141-165, vol. 1, No. 2.
J.C. Hay et al., "A Critical Examination of the Fundamental Relations Used in the Analysis of Nanoindentation Data," Journal of Materials Research, Jun. 1999, pp. 2296-2305, vol. 14, No. 6.
Newport, "MRSI-605 AP: Advanced Packaging Work Cell," Award-Winning, Industry Standard for Advanced Packaging Solutions, Feb. 2008, 6 pages.
English translation for Japanese Application No. JP4887879B2.
English translation for Korean Application No. KR1020070066482A.
English translation for Japanese Application No. JP3851760B2.
English translation for German Application No. DE19818436A1.
English translation for Japanese Application No. JP58068945A.

* cited by examiner

MICRO-SCRUB PROCESS FOR FLUXLESS MICRO-BUMP BONDING

CROSS-REFERENCE TO RELATED APPLICATION

This application claims priority to U.S. Provisional Application Ser. No. 62/239,531, filed on Oct. 9, 2015, the disclosure of which is incorporated herein by reference.

BACKGROUND

Exascale computing is an emerging computing technology that will require the integration and packaging of high performance and low-power multi-core processors and high-bandwidth memory. Conventional techniques for scaling semiconductor devices are becoming increasingly problematic with regard to gate leakage currents and interconnect wiring delays, and are not suitable for exascale computing. Currently, three-dimensional (3D) chip stacking techniques using micro-bump and through-silicon-via (TSV) technologies are being utilized to reduce interconnect lengths and reduce the parasitic capacitance of wiring, which dramatically increases chip performance as compared to traditional 2D IC (integrated circuit) packaging designs.

With conventional solder bump bonding techniques, chip stack yields are improved by removing oxidation (oxide film) from the solder bumps and metallic bonding surfaces using a liquid flux. A flux is a chemical agent that dissolves oxide films on the metal surface of bonding interconnections. This approach requires removing the flux residue after the bonding process to avoid reliability problems. However, as chip sizes increase, and as micro-bump pitch is decreased to achieve higher bandwidth I/Os for 3D applications, the removal of flux residue becomes more difficult.

Fluxless bonding techniques have been proposed. For example, a conventional fluxless bonding method involves flip chip bonding in a reducing atmosphere such as formic acid vapor to dissolve oxide films on solder bumps and metallic bonding surfaces. With this process, however, the use of formic acid raises issues of safety. In addition, the use of formic acid vapor requires additional process steps and time to evacuate all of the reducing gas from the bonding environment for each bonding process. Other fluxless bonding techniques involve pre-applying underfill material with a non-conductive paste (NCP) or a non-conductive film (NCF). NCP and NCF contain flux agent, so they do not need separate flux applying and flux residue cleaning processes. NCP and NCF techniques may not be suitable for bonding large dies with a large number of micro bumps. Indeed, with NCP and NCF techniques, the fillers are sometimes trapped in the bonding interface, and the process requires a high bonding force to eliminate material entrapment between corresponding solder bumps and bonding pads. In addition, depending on the underfill material that is used, NCP and NCF techniques make it difficult to find alignment marks that are utilized by bonding systems for alignment.

SUMMARY

Embodiments provide techniques for micro-bump bonding using a fluxless micro-scrub bonding process. For example, in one embodiment, a method to bond a first semiconductor structure to a second semiconductor structure comprises aligning an array of solder bump structures formed on a bonding surface of the first semiconductor structure to a corresponding array of bonding pads formed on a bonding surface of the second semiconductor structure, wherein the aligning is performed under an applied bonding force so that each solder bump structure is in contact with a corresponding bonding pad. An environment is provided around the aligned arrays of solder bump structures and corresponding bonding pads, wherein the environment is adapted to prevent oxides from forming on surfaces of the solder bump structures and corresponding bonding pads during the bonding process. A scrubbing process is performed to scrub the solder bump structures of the first semiconductor structure against the corresponding bonding pads of the second semiconductor structure in a scrubbing direction that is substantially perpendicular to a direction of the applied bonding force, wherein the scrubbing is performed at a given scrubbing frequency and a given scrubbing amplitude and under the applied bonding force. During the scrubbing process, heat is applied to the first and second semiconductor structures so that solder material of each solder bump structure melts and bonds to the corresponding bonding pad. The first semiconductor structure is then cooled down to solidify the molten solder material of the solder bump structures. The process further comprises maintaining co-planarity between the bonding surfaces of the first and second semiconductor structures within a given tolerance under the applied bonding force during the scrubbing and cooling steps until solidification of the solder material.

Another embodiment of the invention includes a package structure formed by bonding a first semiconductor structure to a second semiconductor structure using a fluxless micro-scrub bonding process.

Other embodiments of the invention will be described in the following detailed description, which is to be read in conjunction with the accompanying drawings.

DETAILED DESCRIPTION

Embodiments will now be described in further detail with regard to systems and methods for bonding semiconductor structures together using fluxless micro-scrub bonding techniques according to embodiments of the invention. A micro-scrubbing process according to an embodiment of the invention can be implemented as part of a flip chip thermo-compression bonding process as a way to remove oxides and contaminates from the bonding surfaces of micro solder bumps without having to use flux and remove flux residues, as required with conventional bonding methods discussed above. Moreover, a micro-scrubbing process according to an embodiment of the invention requires no plasma pre-treatment to eliminate oxide and contaminants from the micro-bump surface. Rather, after aligning an array of micro solder bumps (which are formed on a bonding surface of a first semiconductor structure, e.g., a die) to an array of corresponding bonding pads (which are formed on a bonding surface of a second semiconductor structure, e.g., die or substrate), a micro-scrubbing process is performed under a given bonding force, temperature, atmosphere, and scrubbing frequency/velocity/amplitude to break up and remove oxide films (e.g. tin oxide) from the surface of the solder bumps and thereby enhance the wettability of the solder bumps.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual devices or structures.

Furthermore, it is to be understood that embodiments discussed herein are not limited to the particular materials, features, and processing steps shown and described herein. In particular, with respect to formation (fabricating or processing) steps, it is to be emphasized that the descriptions provided herein are not intended to encompass all of the steps that may be used to form a functional integrated circuit device. Rather, certain steps that are commonly used in forming such devices, such as, for example, but not limited to, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example, 1% or less than the stated amount. Also, in the figures, the illustrated scale of one layer, structure, and/or region relative to another layer, structure, and/or region is not necessarily intended to represent actual scale.

Figure 1:
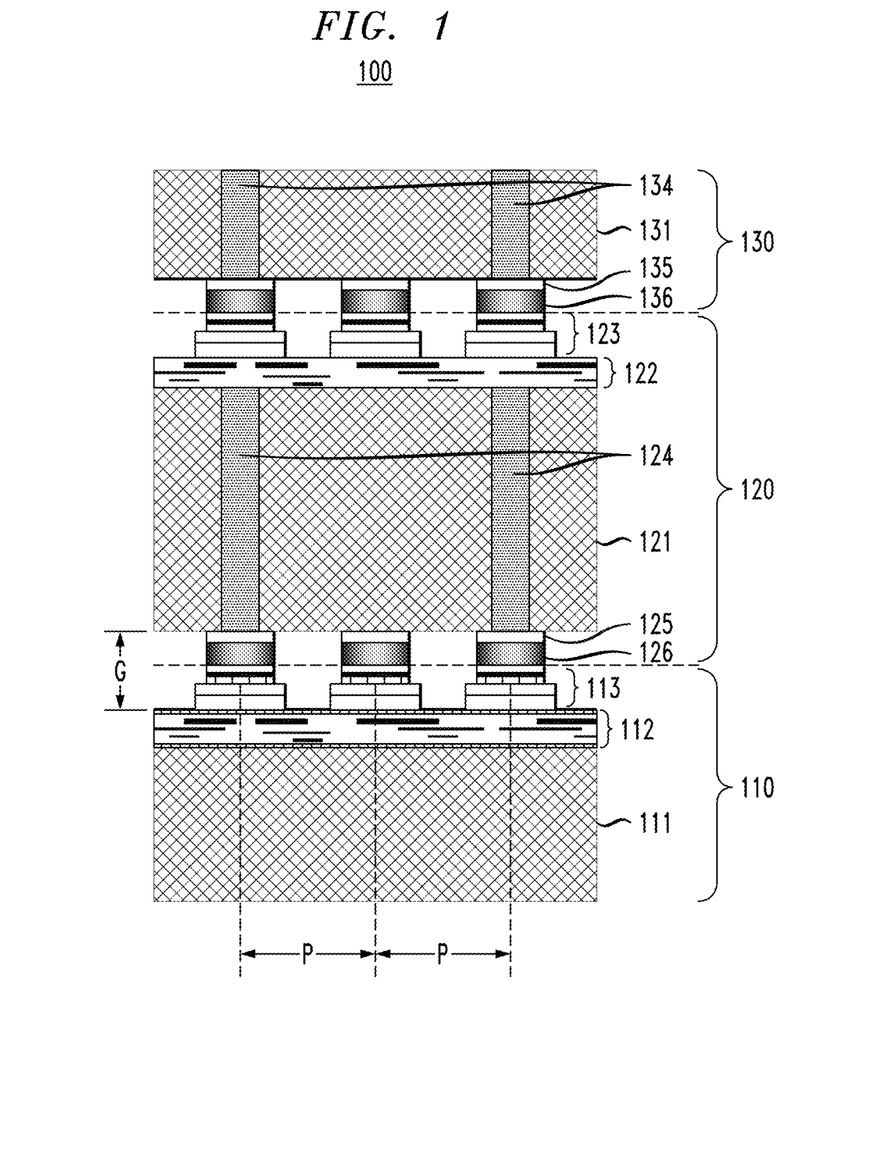
FIG. 1 is a cross-sectional schematic view of a three-dimensional package structure comprising an array of micro-bump connections which can be formed using a fluxless micro-scrub bonding method according to an embodiment of the invention.

FIG. 1 is a cross-sectional schematic view of a three-dimensional package structure comprising an array of micro-bump connections which can be formed using a fluxless micro-scrub bonding method according to an embodiment of the invention. More specifically, FIG. 1 schematically illustrates a package structure 100 comprising a first semiconductor structure 110, a second semiconductor structure 120, and a third semiconductor structure 130, which are bonded together to form a three-dimensional stack structure. The first semiconductor structure 110 comprises a substrate 111, a FEOL (front-end-of-line) and BEOL (back-end-of-line) structure 112, and a plurality of bonding pads 113 connected to metallization of the BEOL. The second semiconductor structure 120 comprises a substrate 121, a FEOL/BEOL structure 122, a plurality of bonding pads 123 connected to metallization of the BEOL, a plurality of through-silicon vias (TSVs) 124, and a plurality of solder bump structures 125/126 each comprising a pillar structure 125 and a solder bump 126. The third semiconductor structure 130 comprises a substrate 131, TSV(s) 134, and a plurality of solder bump structures 135/136 each comprising a pillar structure 135 and a solder bump 136.

In one example embodiment, the semiconductor structures 110, 120 and 130 are individual IC chips (or dies) that are bonded together to form a three-dimensional chip stack structure. In other embodiments, the semiconductor structures 110, 120, and 130 may include wafers or portions or wafers with multiple dies. As shown in FIG. 1, the first semiconductor structure 110 and the second semiconductor structure 120 are bonded together by aligning the array of solder bump structures 125/126 formed on a bonding surface of the second semiconductor structure 120 to the corresponding array of bonding pads 113 formed on a bonding surface of the first semiconductor structure 110, and then bonding the solder bumps 126 to the corresponding bonding pads 113 using a fluxless micro-scrub bonding process according to an embodiment of the invention. Similarly, the second semiconductor structure 120 and the third semiconductor structure 130 are bonded together by aligning the array of solder bump structures 135/136 formed on a bonding surface of the third semiconductor structure 130 to the corresponding array of bonding pads 123 formed on a bonding surface of the second semiconductor structure 120, and then bonding the solder bumps 136 to the corresponding bonding pads 123 using a fluxless micro-scrub bonding process according to an embodiment of the invention.

As further shown in FIG. 1, the TSVs 124 of the second semiconductor structure 120 provide electrical connections between at least a portion of the solder bump structures 125/126 and the FEOL/BEOL structure 122 of the second semiconductor structure 120. Similarly, the TSVs 134 of the third semiconductor structure 130 provide electrical connections between at least a portion of the solder bump structures 135/136 and a FEOL/BEOL structure (not shown) of the third semiconductor structure 130. In this regard, the TSVs 124 and 134 provide electrical connections between circuitry formed as part of the FEOL structures of the semiconductor structures 110, 120, and 130.

In one embodiment, the solder bump structures 125/126 of the second semiconductor structure 120 and the solder bump structures 135/136 of the third semiconductor structure 130 comprise micro-bump structures that each comprise a conductive pillar 125 and 135 (e.g., copper pillars) and a micro-bump of solder material 126 and 136 (e.g., SnAg solder material), formed on the conductive pillar 125 and 135 using known techniques. For example, the Cu pillar and SnAg solder layers can be deposited in sequence by electroplating followed by melting the solder material in a reflow tool to form the solder micro-bumps on the pillars. In one embodiment, the thickness (or height) of the Cu pillars and SnAg micro-solder bumps are about 20 μm and 15 μm, respectively, and each micro-bump has a diameter of about 30 μm. In another embodiment, the height of each micro-bump structure is about 45 μm, which includes a conductive pillar (Cu) with a height of about 10-30 μm and a solder micro-bump with a height of about 10-15 μm. The bonding pads 113 and 123 may comprises multi-layer pad structures comprising, for example, immersion Au plated over a layer of electroless plated Ni. Depending on the heights of the micro-bump structures and bonding pads, when bonded together, a gap size G between the first and second semiconductor structures 110 and 120, and between the second and third semiconductor structures 120 and 13 is in a range of about 10-45 microns.

As further shown in FIG. 1, the array of bonding pads 113 and 123 of the first and second semiconductor structures 110 and 120, and the array of solder bump structures 125/126 and 135/136 of the second and third semiconductor structures 120 and 130 are formed with a pitch P. In one embodiment, the size of the pitch P is about 60 um. Moreover, in one embodiment of the invention, the footprint size of each semiconductor structure 110, 120 and 130 (e.g., dies size) is greater than 600 mm². In this regard, more than 170,000 micro-bump structures 125/126 and 135/136 and corresponding bonding pads 113 and 123 can be fabricated on the bonding surfaces of the respective semiconductor structures 110, 120 and 130.

Figure 2:
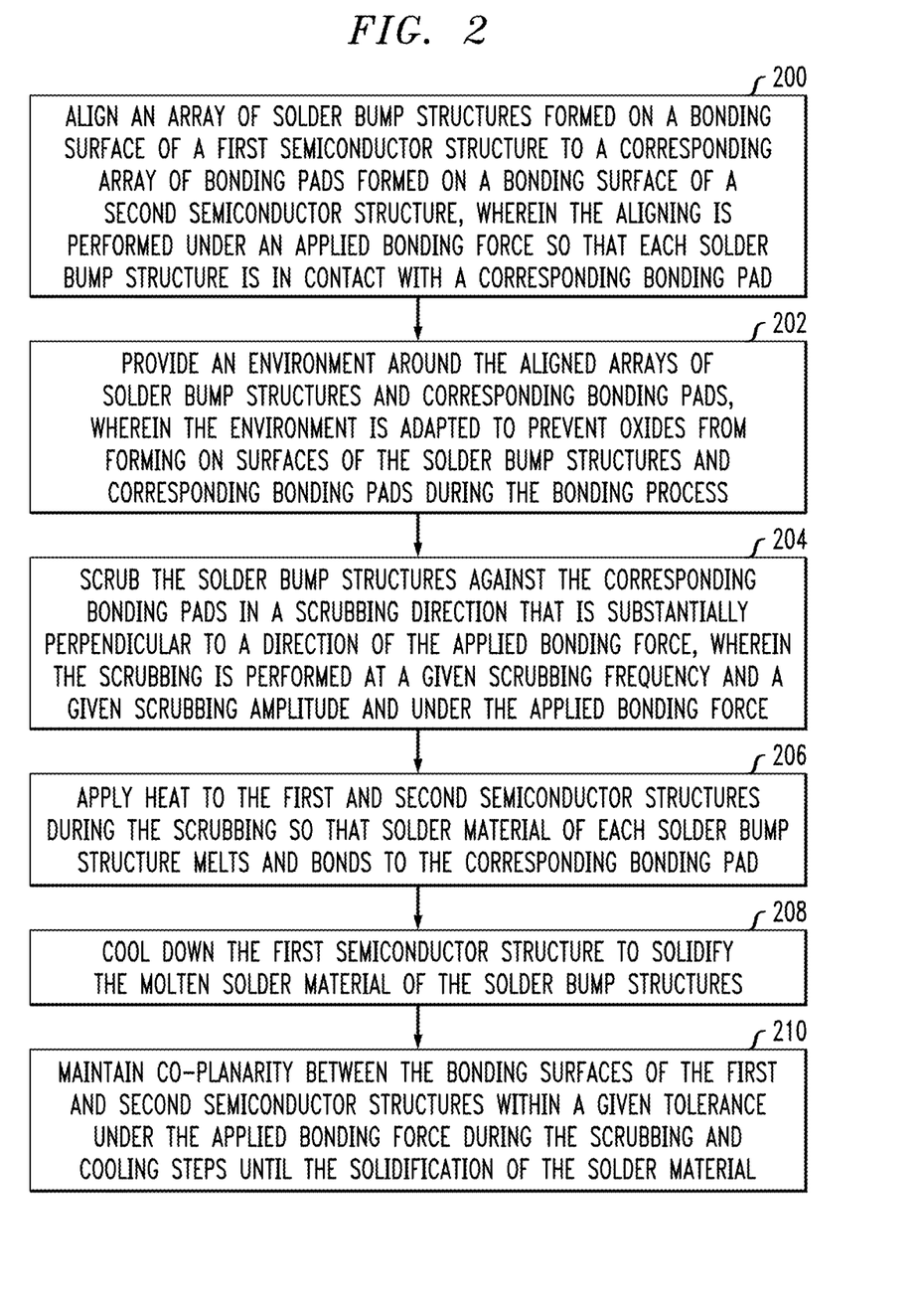
FIG. 2 is a flow diagram of a fluxless micro-scrub bonding process, according to an embodiment of the invention.
Figure 3A:
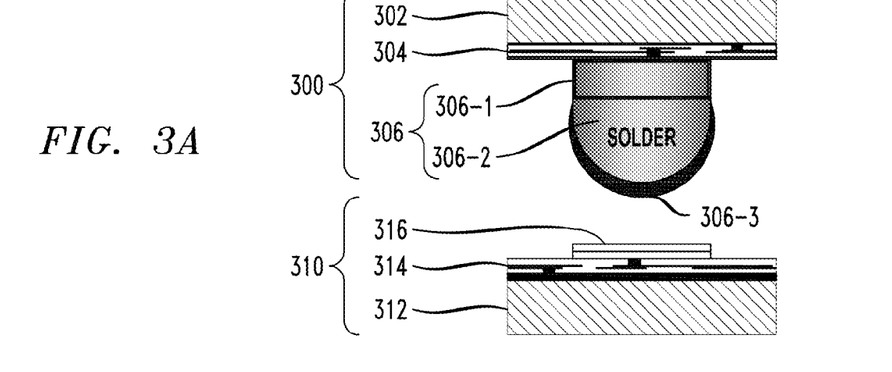
FIGS. 3A, 3B, and 3C schematically illustrates a fluxless micro-scrub bonding process according to an embodiment of the invention.
Figure 3B:
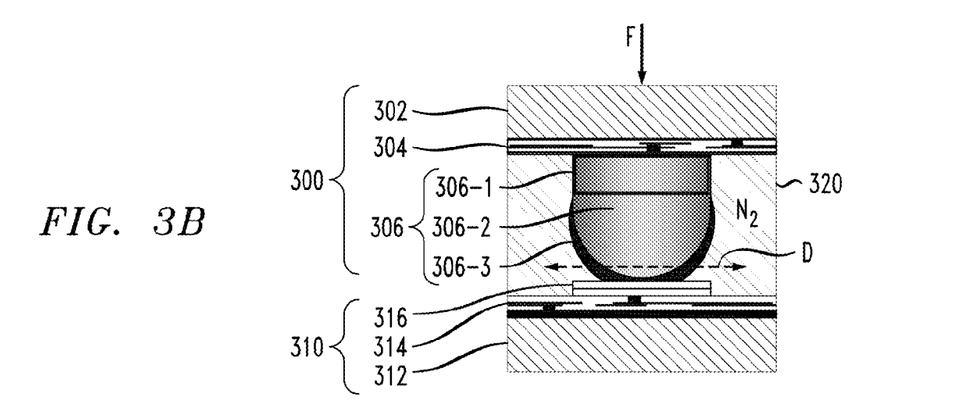
Figure 3C:
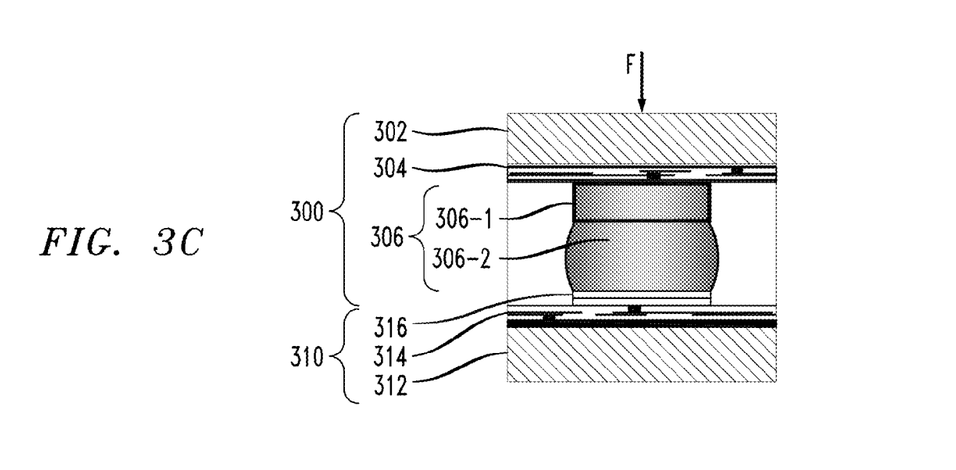
Figure 4:
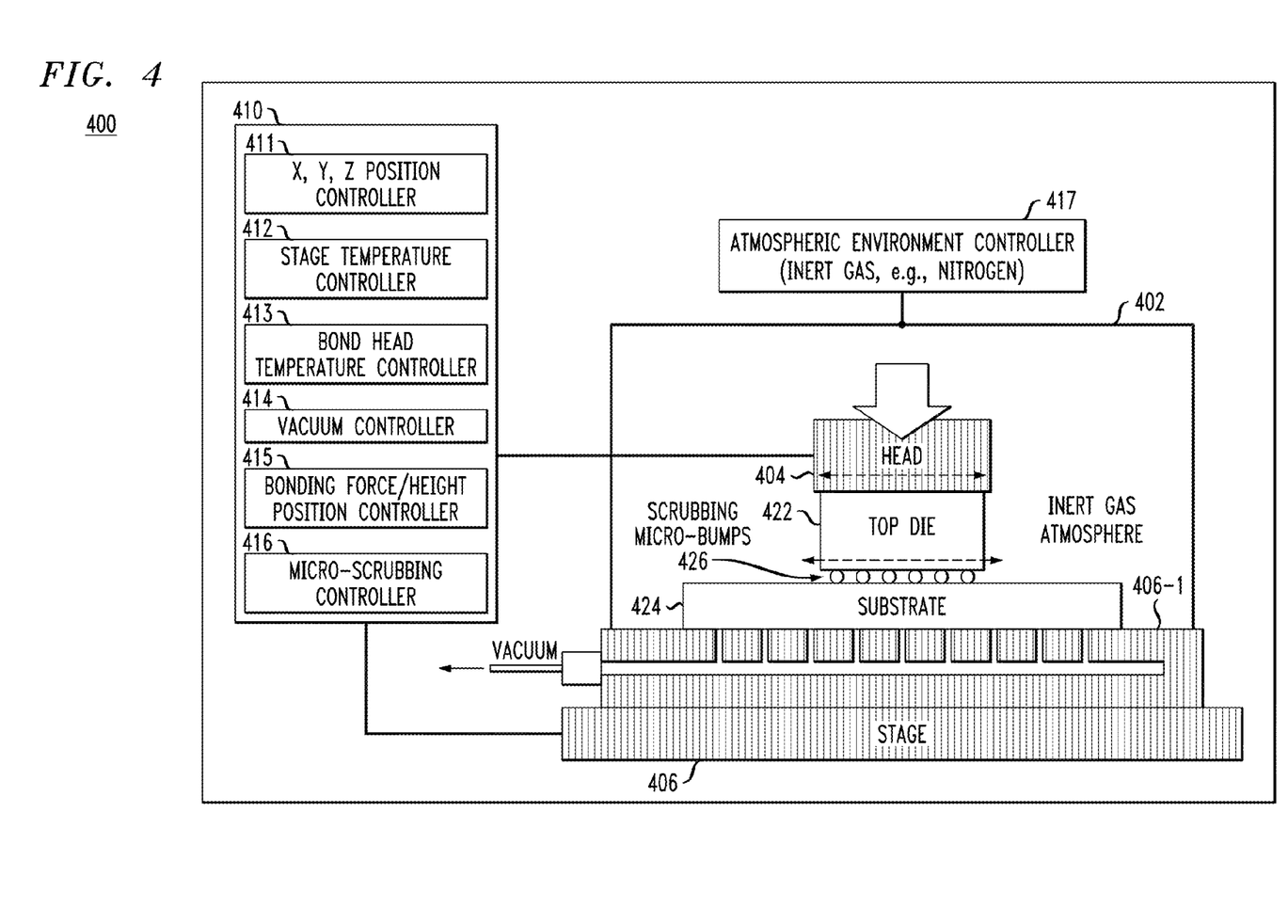
FIG. 4 schematically illustrates a system that is configured to implement a fluxless micro-scrub bonding process, according to an embodiment of the invention.

As noted above, it is problematic to form a package structure (such as shown in FIG. 1) by bonding the semiconductor structures together using conventional solder bump bonding techniques that utilize liquid flux to remove oxidation from the surfaces of the solder bump structures and other metallic bonding surfaces. Indeed, for 3D chip packaging with fine pitch solder bump structures (e.g., P=60 um), small gap sizes (e.g., G=10-45 um), and large die areas (e.g., 600 mm² or greater) with a high I/O count, it is difficult to remove the flux residue after the bonding process due to, e.g., the small micron-sized gaps and high I/O count between the bonding surfaces of adjacent semiconductor structures that are bonded together. Illustrative embodiments overcome these and other drawbacks associated with conventional bonding processes by micro-bump bonding semiconductor structures (e.g., semiconductor dies) together using fluxless micro-scrubbing techniques, as described in further detail below with reference to FIGS. 2, 3A, 3B, 3C and 4, for example. FIG. 2 is a flow diagram of a fluxless micro-scrub bonding process, according to an embodiment of the invention. FIGS. 3A, 3B, and 3C schematically illustrates the fluxless micro-scrub bonding process of FIG. 2, and FIG. 4 schematically illustrates a system that is configured to implement the fluxless micro-scrub bonding process of FIG. 2, according to an embodiment of the invention.

Referring now to FIG. 2, a fluxless micro-scrub bonding process according to an embodiment of the invention comprises an initial step of aligning an array of solder bump structures formed on a bonding surface of a first semiconductor structure to a corresponding array of bonding pads formed on a bonding surface of a second semiconductor structure, wherein the aligning is performed under an applied bonding force so that each solder bump structure is in contact with a corresponding bonding pad (block 200). After alignment, a next step in the process flow comprises providing an environment around the aligned arrays of solder bump structures and corresponding bonding pads, wherein the environment is adapted to prevent oxides from forming on surfaces of the solder bump structures and corresponding bonding pads during the bonding process (block 202). For example, in alternate embodiments of the invention, the "environment" can be a vacuum, or an inert gas atmosphere (e.g., N2 or Argon, etc.), or any other type of environment/atmosphere that is sufficient to prevent the formation of oxides or contaminants on the surfaces of the solder bump structures and corresponding bonding pads during the bonding process.

A scrubbing process is then performed to scrub the solder bump structures of the first semiconductor structure against the corresponding bonding pads of the second semiconductor structure in a scrubbing direction that is substantially perpendicular to a direction of the applied bonding force, wherein the scrubbing is performed at a given scrubbing frequency and a given scrubbing amplitude and under the applied bonding force (block 204). During the scrubbing process, heat is applied to the first and second semiconductor structures so that solder material of each solder bump structure melts and bonds to the corresponding bonding pad (block 206). The first semiconductor structure is then cooled down to solidify the molten solder material of the solder bump structures (block 208). The method further comprises maintaining co-planarity between the bonding surfaces of the first and second semiconductor structures within a given tolerance under the applied bonding force during the scrubbing and cooling steps until solidification of the solder material (block 210). In one embodiment of the invention, the tolerance for maintaining co-planarity between the bonding surfaces of the first and second semiconductor structures is no more than about 5 μm.

The method of FIG. 2 will now be discussed in further detail with regard to FIGS. 3A, 3B, and 3C. FIG. 3A schematically illustrates an initial phase of a fluxless micro-scrub bonding process according to an embodiment of the invention, which comprises aligning an array of solder bump structures formed on a bonding surface of a first semiconductor structure 300 to a corresponding array of bonding pads formed on a bonding surface of a second semiconductor structure 310. In FIG. 3A, the first semiconductor structure 300 comprises a substrate 302, a FEOL/BEOL structure 304, and a micro-bump structure 306. The micro-bump structure 306 comprises a conductive pillar 306-1 (e.g., copper pillar) and a micro solder bump 306-2 (e.g., lead-free solder (SnAg)). In addition, an oxide layer 306-3 is shown at the head of the micro solder bump 306-2. The second semiconductor structure 310 comprises a substrate 312, a FEOL/BEOL structure 314, and a bonding pad 316. As shown in FIG. 3A, the micro-bump structure 306 is aligned to the corresponding bonding pad 316. For ease of illustration, only one micro-bump structure 306 and corresponding bonding pad 316 are shown in FIGS. 3A, 3B, and 3C.

FIG. 3B schematically illustrates a next phase in the exemplary fluxless micro-scrub bonding process, wherein the first semiconductor structure 300 is pressed against the second semiconductor structure 310 with a vertically applied bonding force F so that solder bump 306-2 of the micro-bump structure 306 makes contact to the corresponding bonding pad 316. In this process, there may be a variation in height of the micro-bump structures across the array of micro-bump structures formed on the bonding surface of the first semiconductor structure 300. For example, there may be a 100 nm RMS micro-bump height variation across the array of micro-bumps, which means that the highest micro-bump structures will make contact to the corresponding bonding pads at around several hundred nanometers above the shorter micro-bump structures. In this regard, the vertical bonding force F that is initially applied should be sufficient to compress the solder material of the taller micro-bump structures so that the solder bumps of at least some (or all) of the shorter micro-bump structures make contact to the corresponding bonding pads. In other words, in one embodiment of the invention, the alignment process shown in FIGS. 3A and 3B is performed under a sufficient vertical load (applied bonding force F) so that each solder bump structure is in contact with a corresponding bonding pad and coplanarity between the first and second semiconductor structures is achieved.

FIG. 3B also illustrates a next phase in the exemplary fluxless micro-scrub bonding process which involves providing an environment around the aligned arrays of solder bump structures and corresponding bonding pads, wherein the environment is adapted to prevent oxides and other contaminates from forming on surfaces of the solder bump structures and corresponding bonding pads during the bonding process. In one embodiment of the invention, this process is performed by purging the environment (in which the bonding will occur) of oxygen and other gases through an exhaust, and then filling the environment (in which the bonding will occur) with an inert gas such as diatomic nitrogen (N2) gas 320. Other inert gases may be utilized, such as Argon. The use of an inert gas atmosphere prevents further oxides from growing on the bonding surfaces during a scrubbing process which is performed at elevated temperatures (e.g., greater than 150 degrees Celsius). While low levels of oxygen (e.g., 50 ppm) may be present in the inert gas atmosphere (or other type of environment) during the bonding process, such small levels of oxygen would not result in the formation of oxides on the surfaces of the solder bump structures and corresponding bonding pads.

FIG. 3B also illustrates a next phase in the exemplary fluxless micro-scrub bonding process which involves scrubbing the solder bump structure 306 of the first semiconductor structure 300 back and forth against the corresponding bonding pad 316 of the second semiconductor structure 310 in a scrubbing direction D as indicated by the dashed arrow shown in FIG. 3B. As shown, the back and forth scrubbing direction D is substantially perpendicular to a direction of the applied bonding force F. The scrubbing process is performed at a given scrubbing frequency and a given scrubbing amplitude and under the applied bonding force F, exemplary values of which will be described in further detail below.

The scrubbing process serves various purposes. For example, the scrubbing process serves to break/dissipate the layer of oxide material 306-3 that is present on the micro solder bump 306-2 and thereby enable solder wetting of the corresponding bonding pad 316. In addition, the initial phase of the scrubbing process assists in "solder coining" and elastic deformation of the taller solder bump structures so as to ensure that all the solder bumps of the micro-bump structures are in contact with their corresponding bonding pads. This allows the magnitude of the vertical force F which is applied to the first semiconductor structure 300 to be minimized, while ensuring sufficient compression of the solder material of the micro-bump structures to achieve coplanarity. In addition, the vertical force F is applied to achieve a desired coefficient of friction that provides the requisite frictional forces needed to remove the oxide material on the solder bumps and enable wetting of the bonding pads as the micro solder bumps of the micro-bump structures are scrubbed back and forth across the surfaces of the corresponding bonding pads.

In one embodiment of the invention, prior to the commencement of the scrubbing process, the first and second semiconductor structures can be preheated to a certain temperature below the melting point of the solder material of the micro-bump structures. This preheating serves to heat the solder bumps to a temperature at which the solder bumps are not molten, but which facilities solder creeping and compression upon the initial application of the vertical load and the initial period of the scrubbing process to thereby ensures coplanarity prior to and/or at the beginning phase of the scrubbing process. During the scrubbing process, increased heat is applied to at least the first semiconductor structure 300 so that micro solder bump 306-2 of the solder bump structure 306 melts and bonds to the corresponding bonding pad 316.

For example, in one embodiment of the invention, the temperature of the second semiconductor structure 310 is maintained at around the preheating temperature level, while the temperature of the first semiconductor structure 300 is increased to facilitate melting of the micro solder bump 306-2. By way of further example, in one embodiment of the invention, a sequence of alternating heating and scrubbing sub-steps can be performed as part of a micro-scrubbing operation, which comprises raising the temperature of the first semiconductor structure 300 to a first temperature level, followed by micro-scrubbing, pausing the micro-scrubbing, raising the temperature of the first semiconductor structure 300 to a second temperature level (which is higher than the first temperature level), commencing the micro-scrubbing process again, pausing the micro-scrubbing, raising the temperature of the first semiconductor structure 300 to a third temperature level (which is higher than the second temperature level), commencing the micro-scrubbing process again, and so one, until the micro solder bump 306-2 is molten and bonds to the corresponding bonding pad 316. An example process flow which implements a stepped temperature micro-scrubbing process will be discussed in further detail below with reference to FIG. 5.

FIG. 3C schematically illustrates a next phase in the exemplary fluxless micro-scrub bonding process, wherein the micro solder bump 306-2 is molten and bonded to the corresponding bonding pad 316. The first semiconductor structure 300 is then cooled down to solidify the molten solder material 306-2 of the micro bump structure 306. The applied bonding force F is maintained during the scrubbing and cooling steps until solidification of the solder material, which ensures that co-planarity is maintained between the bonding surfaces of the first and second semiconductor structures 300 and 310 within a given tolerance. It is to be understood that the magnitude of the applied bonding force F can be adjusted during the micro-scrub process as needed to maintain coplanarity and ensure that the molten solder material is not squeezed out and makes contact with molten solder material of a neighboring contact. For example, as heat is applied to the first semiconductor structure 300 and the micro solder bumps become molten, the applied bonding force F may be decreased to counter the expansion force that may occur due to thermal expansion (increase in size) of the various components of the first semiconductor structure 300 as the temperature of the first semiconductor structure 300 increases, while slightly increasing the distance between the bonding surfaces of the first and second semiconductor structures 300 and 310 to ensure that molten solder is not squeezed out and make contact with molten solder of neighboring micro-bump structures.

In an illustrative embodiment, a fluxless micro-scrub bonding process according to an embodiment of the invention can be performed using a bonding system (as shown in FIG. 4) by maintaining the first semiconductor structure 300 (e.g., die) in a securing apparatus (e.g., a bonding head) that mechanically moves relative to the second semiconductor structure 310 (e.g., substrate) which is held in place on a fixed stage. In particular, FIG. 4 schematically illustrates a bonding system 400 that is configured to implement a fluxless micro-scrub bonding process, according to an embodiment of the invention. The system 400 comprises a sealable bonding chamber 402, a bonding head 404, a fixed stage 406 (comprising a vacuum chuck 406-1), and a control system 410. The control system 410 comprises a plurality of sub-controllers to implement various phases of a micro-scrub bonding process as discussed above with reference to FIGS. 2, 3A, 3B and 3C, for example, as well as an exemplary micro-scrub bonding process as discussed below with reference to FIG. 5.

For example, the control system 410 comprises an X, Y, Z position controller 411, a stage temperature controller 412, a bonding head temperatures controller 413, a vacuum controller 414, a bonding force/height position controller 415, and a micro-scrub controller 416. The system 400 further comprises an atmospheric environment controller 417, which is a separate from the control system 410. In another embodiment, the atmospheric environmental controller 417 can be a sub-controller of the control system 410. It is to be understood that the various controllers comprise hardware and/or software configured to perform the various functions. One skilled in the art will appreciate how to implement such controllers in a straightforward manner given the teachings herein.

FIG. 4 illustrates an exemplary bonding process in which a first semiconductor structure 422 (e.g., semiconductor die) is to be bonded to a second semiconductor structure 424 (e.g., carrier substrate) via an array of micro-bumps 426. The bonding head 404 comprises a temperature controllable chip pick-up head that is configured to securely hold and manipulate the first semiconductor structure 422. In one embodiment, the bonding head 404 is configured to work in conjunction with a vacuum system (no shown) to securely hold and manipulate the first semiconductor structure 422 using a vacuum force. In addition, the bonding head 404 comprises a ceramic heating/cooling element that is controlled by the bonding head temperature controller 413 to heat and cool the bonding head 404. The heating/cooling of the bonding head 404 enables heating/cooling of the first semiconductor structure 422 (which is in contact with the bonding head 404) during a bonding process.

The vacuum chuck 406-1 of the fixed stage 406 is configured to apply a vacuum force to securely hold the second semiconductor structure 424 to the fixed stage 406 during a bonding process. The vacuum controller 414 is configured to control the vacuum force (i.e., turn on, turn off, adjust vacuum force) that is applied through the vacuum chuck 406-1 of the fixed stage 406. In addition, the fixed stage 406 comprises a ceramic heating/cooling element that is controlled by the stage temperature controller 412 to heat and cool the fixed stage 406. The heating/cooling of the fixed stage 406 enables heating/cooling of the second semiconductor structure 424 (which is in contact with the fixed stage 406) during a bonding process.

The X, Y, Z position controller 411 is configured to control the X, Y, and Z positioning of the bonding head 404. Prior to a bonding process, the semiconductor structure 422 is secured to the bonding head 404 via a vacuum force, and the position of the bonding head 404 is moved under control of the X, Y, Z position controller 411 to align the array of micro-bump structures 426 formed on the bottom surface of the first semiconductor structure 422 with a corresponding array of bonding pads formed on an upper surface of the second semiconductor structure 424. As noted above, during the alignment and bonding process, the second semiconductor structure 424 is secured to the fixed stage 406 via a vacuum forced exerted under the semiconductor structure 424 via the vacuum chuck 406-1.

The bonding force and height position controller 415 is configured to work in conjunction with the X, Y, Z position controller 411 to apply and maintain, or otherwise dynamically adjust, a vertical bonding force that is applied (in the Z direction) by the bonding head 404 to the first semiconductor structure 422, which translates the vertical bonding force to the micro-bump structures 426, during a bonding process. In one embodiment, the bonding head 404 comprises a load cell sensor which senses a vertical force applied by the bonding head 404 to the aligned first/second semiconductor stack structure 422/424, and which feeds back such information to the bonding force and height position controller 415 so that the applied bonding force and/or a Z position (height) can be adjusted to provide a desired vertical load during various stages of the bonding process.

The micro-scrubbing controller 416 is configured to work in conjunction with the X, Y, Z position controller 411 to move the bonding head 404 (and thus move the first semiconductor structure 422 attached thereto) back and force in an X-Y direction during a scrubbing operation to scrub the micro solder bumps 426 of the first semiconductor structure 422 against corresponding bonding pads of the second semiconductor structure 424. In an alternate embodiment wherein the vacuum stage 406 is movable, a scrubbing operation can be implemented by maintaining the bonding head 404 in a fixed X-Y position, while moving the movable vacuum stage 406 back and forth in an X-Y direction to scrub the micro solder bumps 426 of the first semiconductor structure 422 against corresponding bonding pads of the second semiconductor structure 424.

The micro-scrubbing controller 416 control various micro-scrubbing parameters with regard to the scrubbing operation including, e.g., the scrubbing frequency, the scrubbing velocity, and the scrubbing amplitude, which are applied during a bonding process. The atmospheric environment controller 417 is configured to purge existing gases from the sealable bonding chamber 402 prior to a bonding process, and inject an inert gas (e.g., N2 or Argon) into the bonding chamber 402 to provide an inert gas atmosphere within the bonding chamber 402 for the bonding process.

It is to be appreciated that while one skilled in the art will realize various system designs for a bonding system/tool that can be adapted to perform the micro-scrubbing and bonding process of embodiments described herein, one illustrative bonding system that may be adapted for use with the teachings herein is described in the international patent application identified as International Publication Number WO 2014/186337 filed on May 13, 2014 in the name of MRSI Systems LLC (North Billerica Mass.) and entitled "Thermo-Compression Bonding System, Subsystems, and Methods of Use," the disclosure of which is incorporated by reference herein in its entirety for all purposes. However, it is to be understood that embodiments of the invention are not intended to be limited to the system designs in the WO 2014/186337 patent application.

Figure 5:
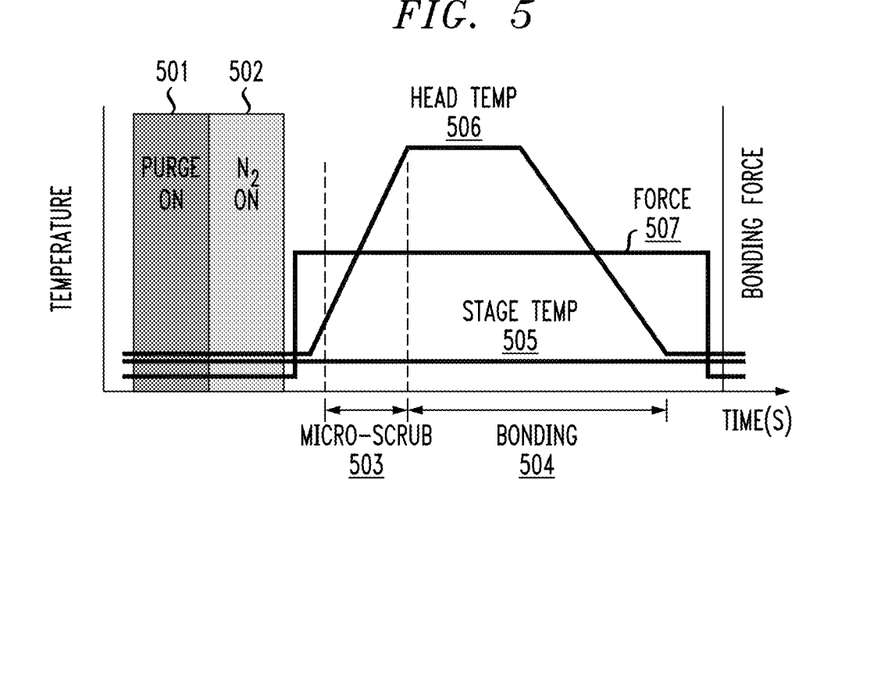
FIG. 5 graphically illustrates a fluxless micro-scrub bonding process according to an embodiment of the invention, which can be implemented using the system of FIG. 4.

FIG. 5 graphically illustrates a fluxless micro-scrub bonding process according to an embodiment of the invention, which can be implemented using the system of FIG. 4. During an initial phase, the second semiconductor structure 424 (e.g., carrier substrate) is placed on the fixed stage 406 in the sealable bonding chamber 402, and the first semiconductor structure 424 (e.g., die) is vacuum secured to the bonding head 404 and positioned within the bonding chamber 402. The array of micro-bump structures 426 on the bonding surface of the first semiconductor structure 422 is aligned to the array of bonding pads on the bonding surface of the second semiconductor structure 424 by controllably moving the bonding head 404 under control of the X, Y, Z position controller 410. In one embodiment of the invention, alignment is performed using a camera that is positioned within the bonding chamber 402. Once alignment is achieved, the camera is removed from the bonding chamber 402 and the seal of the bonding chamber 402 is engaged.

In one embodiment of the invention, following the alignment, the semiconductor structures 422 and 424 are preheated to a certain temperature by setting the ceramic heaters of the bonding head 404 and fixed stage 406 to a temperature of, e.g., 100 degrees Celsius. As noted above, the preheating operation is implemented under control of the stage and bonding head temperature controllers 412 and 413. FIG. 5 illustrates an example stage temperature profile 505 and bonding head temperature profile 506.

As further shown in FIG. 5, during the preheating phase, a purging operation 501 is commenced to remove existing gases from within the sealed bonding chamber 402 by operation of the atmospheric environmental controller 417. In one embodiment of the invention, the purging process is implemented for about 30 seconds. Following the purging operation 501, an inert gas injection phase 502 is commenced to inject an inert gas (such as N2) into the sealed bonding chamber 402 by operation of the atmospheric environmental controller 417. In one embodiment, the inert gas injection phase 502 is implemented for about 30 seconds. In another embodiment, the inert gas is injected into the sealed bonding chamber 402 during the entirety of the bonding process.

Furthermore, either prior to or during the inert gas injection phase 502, the temperatures of the semiconductor structures 422 and 424 are increased by setting the ceramic heaters of the bonding head 404 and the fixed stage 406 to a temperature of, e.g., 200 degrees Celsius. Again, the heating operation is implemented under control of the stage and bonding head temperature controllers 412 and 413.

Once the temperature of the semiconductor structures 422 and 424 (and hence the micro-bump and corresponding bonding pads) reach a temperature level of about 200 degrees Celsius, the vertical bonding force is increased, and a micro-scrubbing phase 503 is commenced under control of the micro-scrubbing controller 416. FIG. 5 illustrates an example bonding force profile 507. In one embodiment, the vertical bonding force is applied with a given magnitude to ensure coplanarity between the bonding surfaces of the semiconductor structures 422 and 424 and to ensure that the micro solder bumps of every micro-bump structure on the bonding surface of the first semiconductor structure 422 make contact to the corresponding bonding pads on the bonding surface of the second semiconductor structure 424.

For example, in one embodiment of the invention, the applied vertical bonding force may be about 500 grams for a plurality of micro-bumps totaling about 170,000 (170K) I/O for which a bump diameter may be about 30 microns. The magnitude of the applied boding force will vary depending on, e.g., the total volume of the solder material of the micro-bump structures, the number of bonding connections in the arrays, the footprint size of the semiconductor structures being bonded together, etc. By way of example, the first semiconductor structure 422 shown in FIG. 4 may have a plurality of micro-bumps (I/O) on the order of about 1,000 (1K), 10,000 (10K), 100,000 (100K), or greater than 100K. The footprint size of the first semiconductor structure 422, in one example embodiment, may be greater than about 10 mm×10 mm.

The micro-scrubbing phase 503 is implemented under control of the micro-scrubbing controller 416, which activates/deactivates the horizontal (X-Y) motion of the bonding head 404 to perform (or pause) a micro-scrubbing process in which the micro solder bumps of the micro bump structures are scrubbed back and forth against the surface of the corresponding bonding pads at a given scrubbing velocity, frequency and amplitude as set by the micro-scrubbing controller 416. As noted above, in one embodiment of the invention, the micro-scrubbing phase 503 can be implemented as a sequence of alternating scrubbing and heating operations.

For example, in one embodiment, the micro-scrub process is commenced with the temperature of the bonding head 404 and fixed stage 406 set at temperature of about 150 degrees Celsius. The micro-scrub process is then paused, and the temperature of the bonding head 404 is set to an increased level of about 250 degrees Celsius. The micro-scrub process is then continued at the increased temperature level of 250 degrees Celsius. The scrubbing process is then paused once again, and the temperature of the bonding head 404 is set to an increased level of 300 degrees Celsius. Once the bonding head 404 reaches 300 degrees Celsius, the micro-scrubbing process is continued at the increased temperature level of 300 degrees Celsius. In one embodiment of the invention, as shown in FIG. 5, the temperature of the fixed stage 406 is essentially maintained constant at the lower preheat temperatures (e.g., between 50 and 200 degrees Celsius).

At the end of the micro-scrubbing phase 503, the micro-scrubbing motion is terminated, and the temperature of the bonding head 404 is further increased to a level of about 350 degrees Celsius to commence a bonding phase 504. During the bonding phase 504, the increase in temperature to 350 degrees Celsius ensures that the micro solder bumps become molten and bond to the corresponding bonding pads. Once melting occurs, the increased temperature (350 degrees Celsius) is maintained for a given amount of time (e.g., 10 second) before commencing a cooling operation to solidify the molten micro solder bumps. For example, in one embodiment of the invention, to commence a cooling operation, the temperature of the bonding head 404 is set to about 200 degrees Celsius, which causes the first semiconductor structure 422 to cool down and, thus, the cooling and solidification of the micro solder bumps. The solidification of the micro solder bumps results in bonding the micro-bump structures to the corresponding bonding pads.

As noted above, the scrubbing velocity, frequency and amplitude of a given micro-scrubbing operation can be controllably set by operation of the micro-scrubbing controller 416. In one embodiment of the invention, the micro-scrubbing velocity is greater than about 10 millimeters per second (mm/sec) with the time to accelerate to the given desired velocity being about 1-10 milliseconds. Further, in one embodiment of the invention, the micro-scrubbing frequency is about 10-30 Hz, and the micro-scrubbing amplitude is kept below a value (Amp) calculated as:

$$\text{Amp} < 0.5(P-t) - R$$

wherein P represents pitch of the micro solder bumps, t denotes a pitch tolerance, and R denotes a radius of the micro solder bumps.

It is to be appreciated that the above formula represents a scrubbing amplitude ceiling below which bridging of neighboring micro-bumps is at least substantially avoided. The pitch P is determined by the sum of the micro-bump diameter and the space between adjacent micro-bumps. Pitch-tolerance t denotes an allowable amount of variation of the pitch P. In one example embodiment, micro-scrubbing is performed by mechanical motion with a scrub amplitude in a range of about 5 um to about 10 um and a scrubbing frequency in a range of about 10-30 hertz (Hz), which prevents bridging of neighboring micro-bumps spaced apart with a pitch of about 61 microns.

Figure 6:
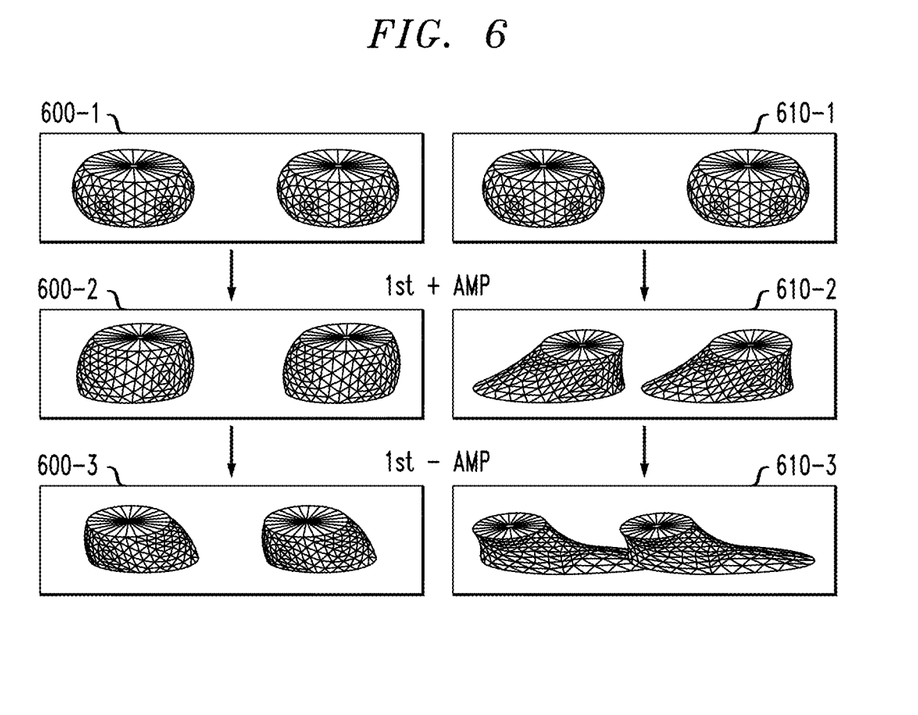
FIG. 6 schematically depicts an interaction between two neighboring solder bumps during a micro-scrubbing bonding operation implemented with different scrubbing amplitudes.

FIG. 6 schematically depicts an interaction between two neighboring solder bumps during a micro-scrubbing bonding operation implemented with different scrubbing amplitudes. In particular, FIG. 6 schematically results of computer simulations that were performed to model the interaction between two neighboring solder bumps during a micro-scrubbing bonding operation implemented with different scrubbing amplitudes. The results shown in blocks 600-1, 600-2 and 600-3 illustrate that no solder bridging occurs between neighboring micro solder bumps under low amplitude scrubbing, whereas the results shown in blocks 610-1, 610-2 and 610-3 illustrate that solder bridging between neighboring micro solder bumps can occur due to high amplitude scrubbing. The computer modeling results (as shown in FIG. 6) indicate that under the scrubbing frequencies we investigated, the dynamic force is overshadowed by liquid surface tension. Under low amplitude scrubbing, the liquid solder was retained by surface tension, and the scrubbing process did not cause solder bridging. Solder bridging only occurs when the scrubbing amplitude drives the envelope of one solder bump into neighboring bumps. In order to prevent solder bridging, the micro-scrubbing amplitude (Amp) is kept below a value calculated using the above formula.

It is to be appreciated that a micro-scrubbing motion is different from a vibrational motion of conventional ultrasonic welding. That is, ultrasonic welding is used for moving relatively low masses at higher frequencies. Also, for conventional eutectic die bonding between a die and a substrate which involves vibration, the solder is either pre-deposited or in the form of a preform that is placed prior to placement of the die. The solder acts as a uniform ground plane under the die and a conduit for the heat to be transferred from the die to the substrate when operating. Eutectic die bonding motion is done primarily for smaller power devices (i.e., about 10 millimeters) with limited electrical connections (I/O). The die attach precision requirement is typically +/−12-20 µm. Also, for eutectic die bonding, there are no features on the die back side that need to match with high precision corresponding features on the substrates.

In contrast, illustrative embodiments of micro-scrub techniques discussed herein are advantageously applicable to dies with large footprints and relatively high I/O counts (e.g., about 100,000 I/O or greater) where the die backside features need to precisely line up with corresponding features on the substrate, while maintaining precision and co-planarity before, during and after micro-scrubbing. Since each I/O connection is in close proximity to its neighbor, the solder from one connection must not bridge to its neighbor. This implies that during micro-scrubbing, the scrubbing amplitude is limited so that the solder at each I/O connection is confined and not allowed to get close to its nearest neighbor. Moreover, the scrubbing velocity should be controlled so that the scrubbing motion is at least substantially "jerk" free to minimize solder (which is close to a liquid state during bonding) from being "splashed" and thereby bridging to its neighbor.

To assess the efficacy of micro-scrubbing bonding techniques according to embodiments of the invention, we performed actual experiments using a test vehicle with 20-µm/15-µm thick Cu/SnAg micro-bumps (formed on a first die) and Ni/Au pads (formed on a second die) at a 61 µm pitch. The semiconductor dies were larger than 600 mm$^2$. In addition, more than 170,000 micro-bumps were fabricated in the test vehicle and each bump had a 30-µm diameter. The Cu and SnAg layers were deposited in sequence by electroplating and the solder bumps were melted in a reflow tool. The top die and bottom die were bonded with parameters (e.g., bonding force, scrubbing frequency, scrubbing velocity, scrubbing amplitude, etc.) developed for a micro-scrub bonding process. After each die made contact with precise alignment, the micro-scrub process was performed under a specific force, temperature, and atmosphere as part of a thermo-compression bonding process. The mechanical micro-scrub action was found to break up native tin oxide films on the micro solder bumps, and thereby improve the wettability of the solder. X-ray images confirmed that there was no solder bump bridging across the full die area. Moreover, neither voids nor cracks were observed at the solder joints by SEM cross sectional analysis.

It is to be understood that the methods discussed herein for fabricating semiconductor structures can be incorporated within semiconductor processing flows for fabricating various types of semiconductor package structures having integrated circuit chips with various analog and digital circuitry or mixed-signal circuitry. In particular, a plurality of integrated circuit dies with various devices such as transistors, diodes, capacitors, inductors, etc., can be bonded together to form a 3D stacked structure for high density applications. A package structure having a plurality of integrated circuit dies bonded together in a stacked 3D structure using micro-scrub bonding techniques as described herein can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuit package structures are considered part of the embodiments described herein.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:
1. A method, comprising:
aligning an array of solder bump structures formed on a bonding surface of a first semiconductor structure to a corresponding array of bonding pads formed on a bonding surface of a second semiconductor structure, wherein the aligning is performed under an applied bonding force so that each solder bump structure is in contact with a corresponding bonding pad;
providing an environment around the aligned arrays of solder bump structures and corresponding bonding pads, wherein the environment is adapted to prevent oxides from forming on surfaces of the solder bump structures and corresponding bonding pads;
scrubbing the solder bump structures of the first semiconductor structure against the corresponding bonding pads of the second semiconductor structure in a scrubbing direction that is perpendicular to a direction of the applied bonding force, wherein the scrubbing is performed at a given scrubbing frequency and a given scrubbing amplitude and under the applied bonding force, and wherein the scrubbing is performed after the aligning;
applying heat to the first and second semiconductor structures during the scrubbing so that solder material of each solder bump structure melts and bonds to the corresponding bonding pad;

cooling down the first semiconductor structure to solidify the molten solder material of the solder bump structures; and maintaining co-planarity between the bonding surfaces of the first and second semiconductor structures within a given tolerance under the applied bonding force during, the scrubbing and cooling steps until solidification of the solder material;

wherein the scrubbing of the solder bump structures of the first semiconductor structure against the corresponding bonding pads of the second semiconductor structure begins prior to melting of the solder bump structures of the first semiconductor structure.

2. The method of claim 1, wherein the sold er bump structures comprise micron-scaled solder bump structures.

3. The method of claim 2, wherein each micron-scaled solder bump structure comprises tin-based solder material.

4. The method of claim 2, wherein each micron-scaled solder bump structure has a height that is less than about 45 microns.

5. The method of claim 4, wherein each micron-scaled solder bump structure comprises a copper pillar with a height of about 10-30 microns and a solder bump with a height of about 10-15 microns.

6. The method of claim 2, wherein the scrubbing amplitude is a function of a pitch and a radius associated with solder bumps of the micron-scaled solder bump structure.

7. The method of claim 6, where the scrubbing amplitude is maintained below a value equivalent to half the pitch between the solder bumps minus the radius of the solder bumps.

8. The method of claim 1, wherein the scrubbing frequency is in a range of about 10 hertz to about 30 hertz.

9. The method of claim 1, wherein the given tolerance of co-planarity maintained between the bonding surfaces of the first and second semiconductor structures is less than about 5 microns.

10. The method of claim 1, further comprising adjusting a magnitude of the bonding force applied during the scrubbing and/or cooling phases.

11. The method of claim 1, wherein applying heat to the first and second semiconductor structures during the scrubbing comprises sequentially performing heating and scrubbing steps whereby heat at one temperature level is applied followed by the scrubbing step, and the scrubbing step is stopped and heat at a higher temperature level is applied followed by the scrubbing step such that the sequence is repeated until each solder bump structure melts and bonds to the corresponding bonding pad.

12. The method of claim 1, wherein providing an environment around the aligned arrays of solder bump structures and corresponding bonding pads comprises providing an inert gas atmosphere.

* * * * *